(12) United States Patent
Han et al.

(10) Patent No.: US 11,569,269 B2
(45) Date of Patent: Jan. 31, 2023

(54) DISPLAY APPARATUS AND METHOD OF MANUFACTURING THE SAME

(71) Applicant: Samsung Display Co., Ltd., Yongin-si (KR)

(72) Inventors: Jaebum Han, Yongin-si (KR); Bohwa Kim, Yongin-si (KR); Younggil Park, Yongin-si (KR); Junghwa Park, Yongin-si (KR); Nari Ahn, Yongin-si (KR); Sooim Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 87 days.

(21) Appl. No.: 17/144,696

(22) Filed: Jan. 8, 2021

(65) Prior Publication Data
US 2021/0375950 A1 Dec. 2, 2021

(30) Foreign Application Priority Data

May 29, 2020 (KR) .................. 10-2020-0065185

(51) Int. Cl.
| | |
|---|---|
| H01L 27/12 | (2006.01) |
| H01L 27/32 | (2006.01) |
| H01L 51/00 | (2006.01) |
| H01L 51/56 | (2006.01) |

(52) U.S. Cl.
CPC ...... *H01L 27/1218* (2013.01); *H01L 27/1262* (2013.01); *H01L 51/0015* (2013.01); *H01L 51/56* (2013.01)

(58) Field of Classification Search
CPC ............ H01L 27/1218; H01L 27/1262; H01L 51/0015; H01L 51/56
See application file for complete search history.

(56) References Cited

U.S. PATENT DOCUMENTS

| | | | |
|---|---|---|---|
| 8,395,157 B2 | 3/2013 | Park et al. | |
| 9,136,388 B2 | 9/2015 | Yamazaki et al. | |
| 10,134,878 B2 | 11/2018 | Hsu et al. | |
| 2011/0124164 A1* | 5/2011 | Noda | H01L 31/022425 257/E21.409 |
| 2012/0104386 A1* | 5/2012 | Miyairi | H01L 29/7869 257/E27.06 |
| 2013/0244374 A1* | 9/2013 | Okazaki | H01L 29/4908 438/104 |

(Continued)

FOREIGN PATENT DOCUMENTS

| | | |
|---|---|---|
| KR | 10-0991559 | 11/2010 |
| KR | 10-2015-0126558 | 11/2015 |

(Continued)

*Primary Examiner* — Mohsen Ahmadi
(74) *Attorney, Agent, or Firm* — Kile Park Reed & Houtteman PLLC

(57) ABSTRACT

A display apparatus is provided which may include a substrate including a display area and a non-display area adjacent to the display area, a first thin-film transistor disposed on the substrate and including a first semiconductor layer including an oxide semiconductor material, and a second thin-film transistor disposed on the substrate and including a second semiconductor layer including a silicon semiconductor material, wherein a surface roughness of the first semiconductor layer is increased by plasma treatment. A method of manufacturing the display apparatus is also provided.

15 Claims, 13 Drawing Sheets

(56) References Cited

U.S. PATENT DOCUMENTS

| | | | |
|---|---|---|---|
| 2015/0317014 A1 | 11/2015 | Miyake et al. | |
| 2016/0063924 A1* | 3/2016 | Oh | H01L 27/1237 345/83 |
| 2016/0118416 A1* | 4/2016 | Yamazaki | H01L 27/1218 257/43 |
| 2018/0374956 A1* | 12/2018 | Lee | H01L 29/7869 |
| 2019/0027502 A1* | 1/2019 | Park | H01L 27/1255 |
| 2019/0044027 A1* | 2/2019 | Lee | H01L 33/32 |
| 2019/0074304 A1* | 3/2019 | Lee | H01L 29/78648 |
| 2019/0096925 A1* | 3/2019 | Lee | H01L 27/124 |
| 2019/0305065 A1* | 10/2019 | Kim | H01L 27/124 |
| 2020/0135772 A1* | 4/2020 | Lee | G09G 3/3233 |

FOREIGN PATENT DOCUMENTS

| | | |
|---|---|---|
| KR | 10-2018-0095115 | 8/2018 |
| KR | 10-2019-0119010 | 10/2019 |

\* cited by examiner

FIG. 7

| at% | 134a | 135a | 135b |
|---|---|---|---|
| O | 56.24 | 62.94 | 59.12 |
| Zn | 13.78 | 3.18 | 2.46 |
| Ga | 19.29 | 4.74 | 3.86 |
| In | 10.67 | 29.12 | 34.56 |

DISPLAY APPARATUS AND METHOD OF MANUFACTURING THE SAME

CROSS-REFERENCE TO RELATED APPLICATION(S)

This application claims priority to and benefits of Korean Patent Application No. 10-2020-0065185 under 35 U.S.C. § 119, filed on May 29, 2020 in the Korean Intellectual Property Office, the entire contents of which are incorporated herein by reference.

BACKGROUND

1. Technical Field

The disclosure relates to a display apparatus with improved device properties and a method of manufacturing the same.

2. Description of the Related Art

Display apparatuses may include display elements and driving circuits for controlling electrical signals applied to the display elements. A driving circuit may include a thin-film transistor, a storage capacitor, and lines.

To precisely control the light emission and light emission intensity of a display element, the number of thin-film transistors electrically connected to one display element has been increased. Accordingly, research has been actively conducted to find solutions regarding the high integration and low power consumption of display apparatuses.

SUMMARY

Embodiments of the disclosure provide a display apparatus which is driven by a thin-film transistor including a silicon semiconductor and a thin-film transistor including an oxide semiconductor to reduce the power consumption of the display apparatus and enable high integration thereof.

However, the scope of the disclosure is not limited thereto.

Additional aspects will be set forth in part in the description which follows and, in part, will be apparent from the description, or may be learned by practice of the embodiments of the disclosure.

According to an aspect, a display apparatus may include a substrate including a display area and a non-display area adjacent to the display area, a first thin-film transistor disposed on the substrate and including a first semiconductor layer including an oxide semiconductor material, and a second thin-film transistor disposed on the substrate and including a second semiconductor layer including a silicon semiconductor material, wherein a surface roughness of the first semiconductor layer may be increased by plasma treatment.

In an embodiment, the surface roughness of the first semiconductor layer may be in a range of about 2 nm to about 30 nm.

In an embodiment, the first semiconductor layer may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In an embodiment, a protruding portion may be formed on the surface of the first semiconductor layer by the plasma treatment, and an indium (In) content of the protruding portion may be greater than a gallium (Ga) content of the protruding portion or a zinc (Zn) content of the protruding portion.

In an embodiment, the indium (In) content of the protruding portion may be greater than an indium (In) content of a body portion of the first semiconductor layer.

In an embodiment, the first thin-film transistor may include a gate electrode overlapping the first semiconductor layer, and may include an insulating layer disposed between the first semiconductor layer and the gate electrode.

In an embodiment, the insulating layer may overlap the first semiconductor layer.

In an embodiment, the first semiconductor layer and the second semiconductor layer may be disposed on different layers.

In an embodiment, the display apparatus may further include a lower metal layer disposed between the substrate and the first semiconductor layer to overlap the first semiconductor layer.

According to another aspect, a method of manufacturing a display apparatus may include forming a first semiconductor layer including an oxide semiconductor material on a substrate, increasing a surface roughness of the first semiconductor layer, forming an insulating layer on the first semiconductor layer, forming a metal layer on the insulating layer, and patterning the metal layer to form a gate electrode.

In an embodiment, the method may further include, prior to the forming of the first semiconductor layer including the oxide semiconductor material on the substrate, forming a second semiconductor layer including a silicon semiconductor material on the substrate.

In an embodiment, the method may further include, prior to the forming of the first semiconductor layer including the oxide semiconductor material on the substrate, forming a lower metal layer arranged to overlap the first semiconductor layer.

In an embodiment, the first semiconductor layer and the second semiconductor layer may be formed on different layers.

In an embodiment, the increasing of the surface roughness of the first semiconductor layer may include performing a plasma treatment on a surface of the first semiconductor layer to form a protruding portion on the surface of the first semiconductor layer.

In an embodiment, the surface roughness of the first semiconductor layer may be in a range of about 2 nm to about 30 nm.

In an embodiment, the patterning of the metal layer to form the gate electrode may include diffusing impurities into the first semiconductor layer to form a drain region and a source region.

In an embodiment, the first semiconductor layer may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In an embodiment, an indium (In) content of the protruding portion may be greater than a gallium (Ga) content of the protruding portion or a zinc (Zn) content of the protruding portion.

In an embodiment, the indium (In) content of the protruding portion may be greater than an indium (In) content of a body portion of the first semiconductor layer.

In an embodiment, the insulating layer may overlap the first semiconductor layer.

Aspects, features, and advantages other than those described above will become apparent from the following detailed description, claims, and drawings to implement embodiments.

BRIEF DESCRIPTION OF THE DRAWINGS

The above and other aspects, features, and advantages of embodiments of the disclosure will be more apparent from the following description taken in conjunction with the accompanying drawings, in which:

FIG. 7 is a table illustrating the composition ratio of each area of a first semiconductor layer according to an embodiment.

DETAILED DESCRIPTION OF THE EMBODIMENTS

Figure 1:
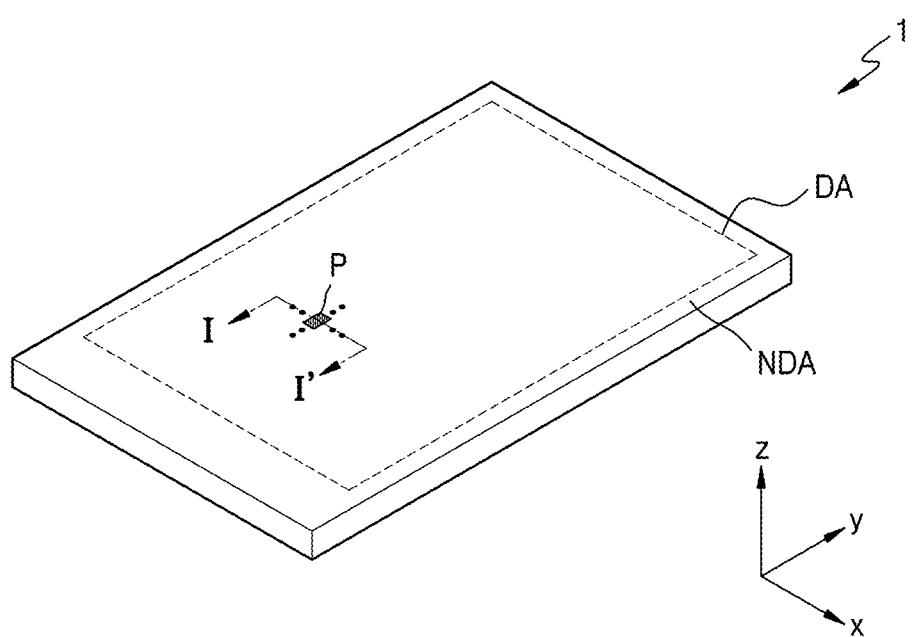
FIG. 1 is a schematic perspective view illustrating a display apparatus according to an embodiment.

The disclosure may have various modifications and examples, and specific embodiments will be illustrated in drawings and explained in detail. Effects and features of the disclosure and methods of accomplishing the same may be understood more readily by reference to the following detailed description of embodiments and the accompanying drawings. However, the disclosure is not limited to the embodiments described below, but may be implemented in various forms.

In the embodiments, terms such as "first" and "second" are used for distinguishing one component from other components, but the components are not limited to these terms. These elements are only used to distinguish one element from another.

In the embodiments, unless clearly used otherwise, expressions in the singular number include a plural meaning.

In the embodiments, terms such as "comprises," "comprising," "includes," "including," "have," "having," "contains," and/or "containing" used herein specify the presence of stated features or elements, but do not preclude the presence or addition of one or more other features or elements.

In the embodiments, when an element such as a film, area or component is referred to as being "on" or "above" another element, it can be directly on or over the other element or intervening elements may also be present.

For convenience of description, dimensions of components in the drawings may be expanded or reduced. For example, the size and thickness of each component shown in the drawings are arbitrarily shown for convenience of description, and therefore the disclosure is not necessarily limited to those illustrated in the drawings.

In the specification, the phrase "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, or C" may indicate only A, only B, only C, both A and B, both A and C, both B and C, all of A, B, and C, or variations thereof.

In the embodiments, "a line extends in a first direction or a second direction" means not only that the line extends in a straight line shape but also that the line extends in a zigzag or curve along the first direction or the second direction.

When an embodiment may be implemented differently, a specific process order may be performed differently from the described order. For example, two consecutively described processes may be performed substantially at the same time or performed in an order opposite to the described order In the embodiments, the phrase "in a plan view" means viewing a target portion from the top, and the phrase "in a cross-sectional view" means viewing a cross-section formed by vertically cutting a target portion from the side. In the following embodiments, when an element "overlaps" another element, the element overlaps the other element "in a plan view" or "in a cross-sectional view".

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings, and the same or corresponding components will be denoted by the same reference numerals.

FIG. 1 is a schematic perspective view illustrating a display apparatus according to an embodiment.

Referring to FIG. 1, the display apparatus 1 may include a display area DA and a non-display area NDA adjacent to the display area DA. The non-display area NDA may surround the display area DA. The display apparatus 1 may provide an image using light emitted from pixels P arranged in the display area DA, and the non-display area NDA may be an area on which any image is not displayed.

Hereinafter, an organic light-emitting display will be described as an example of the display apparatus 1 according to an embodiment, but the display apparatus of the disclosure is not limited thereto. In an embodiment, the display apparatus 1 may be an inorganic light-emitting display, an inorganic EL display or a display apparatus such as a quantum dot light-emitting display. For example, an emission layer of a display element provided in the display apparatus 1 may include an organic material, an inorganic material, a quantum dot, an organic material and a quantum dot, or an inorganic material and a quantum dot.

Although FIG. 1 illustrates a display apparatus 1 having a flat display surface, the disclosure is not limited thereto. In an embodiment, the display apparatus 1 may include a stereoscopic display surface or a curved display surface.

If the display apparatus 1 includes a stereoscopic display surface, the display apparatus 1 may include display areas indicating different directions, for example, a polygonal pillar-shaped display surface. In an embodiment, if the display apparatus 1 includes a curved display surface, the display apparatus 1 may be implemented in various forms such as a flexible display apparatus, a foldable display apparatus, and a rollable display apparatus.

FIG. 1 illustrates a display apparatus 1 applicable to a mobile phone terminal. Although not shown in the drawings, electronic modules, a camera module, a power module, and the like mounted on a main board may be arranged in a bracket or case together with the display apparatus 1, thereby constituting a mobile phone terminal. In particular, the display apparatus 1 according to the disclosure may be applied to large-sized electronic devices such as televisions and monitors, and small- or medium-sized electronic devices such as tablet PCs, vehicle navigation systems, game consoles, and smart watches.

Although FIG. 1 illustrates the display area DA of the display apparatus 1 having a quadrangular shape, the shape of the display area DA may be a circular, elliptical, or polygonal shape such as a triangle or a pentagon.

The display apparatus 1 may include pixels P arranged in the display area DA. Each of the pixels P may include an organic light-emitting diode OLED. Each of the pixels P may emit, for example, red, green, blue, or white light through the organic light-emitting diode OLED. As described above, the pixel P in the specification may be understood as a pixel which emits light of any one of red, green, blue, and white colors.

Figure 2:
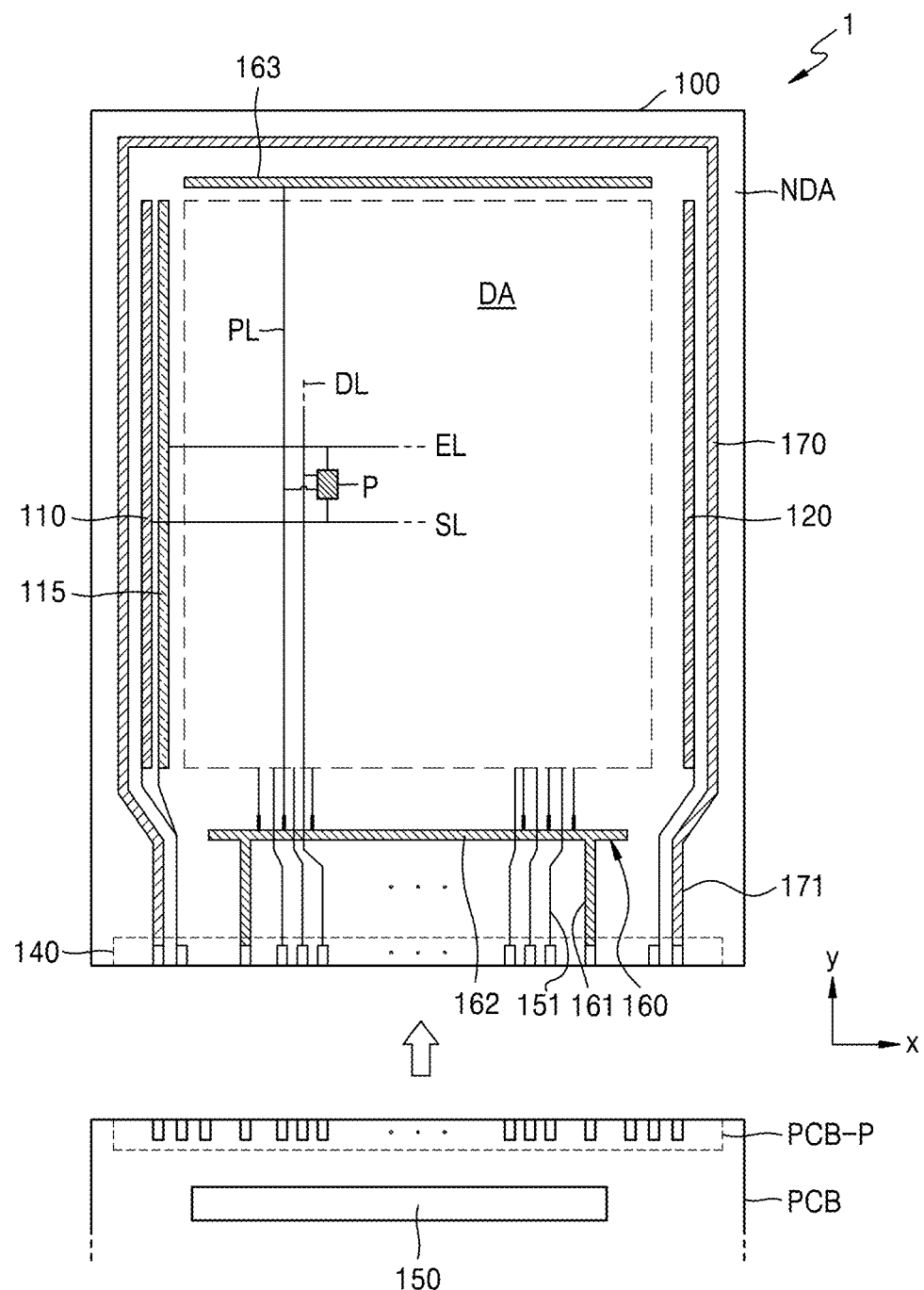
FIG. 2 is a schematic plan view illustrating a display apparatus according to an embodiment.

FIG. 2 is a schematic plan view illustrating a display apparatus according to an embodiment.

Referring to FIG. 2, the display apparatus 1 may include pixels P arranged in the display area DA. Each of the pixels P may include a display element such as an organic light-emitting diode (OLED). Each of the pixels P may emit, for example, red, green, blue, or white light through the organic light-emitting diode OLED. As described above, the pixel P in the specification may be understood as a pixel which emits light of any one of red, green, blue, and white colors.

Each pixel P may be electrically connected to peripheral circuits arranged in the non-display area NDA. A first scan driving circuit 110, a first emission driving circuit 115, a second scan driving circuit 120, a terminal 140, a data driving circuit 150, a first power supply line 160, and a second power supply line 170 may be arranged in the non-display area NDA.

The first scan driving circuit 110 may supply a scan signal to each pixel P through a scan line SL. The first emission driving circuit 115 may supply an emission control signal to each pixel P through an emission control line EL. The second scan driving circuit 120 may be arranged in parallel with the first scan driving circuit 110 with the display area DA therebetween. Some of the pixels P arranged in the display area DA may be electrically connected to the first scan driving circuit 110, and the rest may be electrically connected to the second scan driving circuit 120. In an embodiment, the second scan driving circuit 120 may be omitted.

The first emission driving circuit 115 may be spaced apart from the first scan driving circuit 110 in the x-direction and may be arranged in the non-display area NDA. The first emission driving circuit 115 and the first scan driving circuit 110 may be alternately arranged in the y direction.

The terminal 140 may be arranged at one side of the substrate 100. The terminal 140 may be exposed, instead of being covered by an insulating layer, and may be electrically connected to a printed circuit board PCB. A port PCB-P of the printed circuit board PCB may be electrically connected to the terminal 140 of the display apparatus 1. The printed circuit board PCB may transmit a signal or power of a controller (not shown) to the display apparatus 1. A control signal generated in the controller may be transmitted to the first scan driving circuit 110, the first emission driving circuit 115, and the second scan driving circuit 120, respectively, through the printed circuit board PCB. The controller may supply a first power voltage ELVDD and a second power voltage ELVSS to the first power supply line 160 and the second power supply line 170 through a first connection line 161 and a second connection line 171, respectively. The first power voltage ELVDD may be supplied to the pixel P through a driving voltage line PL connected to the first power supply line 160, and the second power voltage ELVSS may be supplied to an opposite electrode of the pixel P connected to the second power supply line 170.

A data driving circuit 150 may be electrically connected to a data line DL. A data signal of the data driving circuit 150 may be supplied to each pixel P through a connection line 151 connected to the terminal 140 and the data line DL connected to the connection line 151.

Although FIG. 2 illustrates the data driving circuit 150 arranged on the printed circuit board PCB, in an embodiment, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 that extend in the x-direction in parallel with each other with the display area DA therebetween. The second power supply line 170 may partially surround the display area DA in the form of a loop with one open side.

Figure 3:
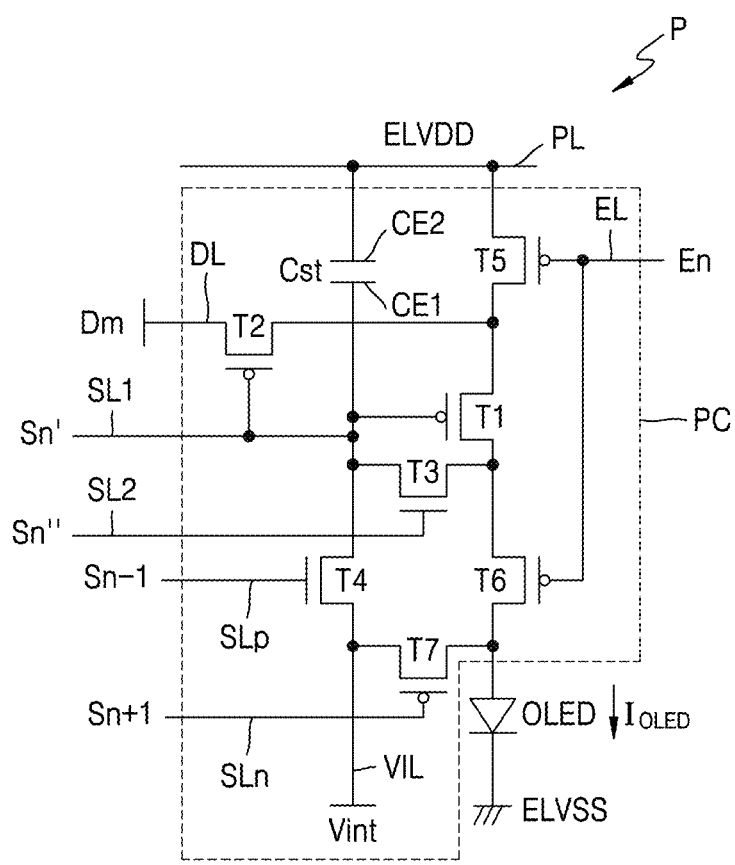
FIG. 3 is a schematic diagram of an equivalent circuit of a pixel that may be included in a display apparatus according to an embodiment.

FIG. 3 is a schematic diagram of an equivalent circuit of a pixel that may be included in the display apparatus according to an embodiment.

Referring to FIG. 3, each pixel P may include a pixel circuit PC and an organic light-emitting diode OLED electrically connected to the pixel circuit PC.

In an embodiment, the pixel circuit PC may include thin-film transistors T1 to T7 and a storage capacitor Cst. The thin-film transistors T1 to T7 and the storage capacitor Cst may be connected to signal lines SL1, SL2, SLp, SLn, EL, and DL, an initialization voltage line VIL, and a driving voltage line PL. In some embodiments, at least one of the signal lines SL1, SL2, SLp, SLn, EL, or DL, for example, the initialization voltage line VIL and/or the driving voltage line PL, may be shared by neighboring pixels P.

The thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Some of the thin-film transistors T1 to T7 may be n-channel MOSFETs (NMOS), and the rest may be p-channel MOSFETs (PMOS).

For example, the compensation thin-film transistor T3 and the first initialization thin-film transistor T4 of the thin-film transistors T1 to T7 may be n-channel MOSFETs (NMOS), and the rest may be p-channel MOSFETs (PMOS).

In an embodiment, the compensation thin-film transistor T3, the first initialization thin-film transistor T4, and the second initialization thin-film transistor T7 of the thin-film transistors T1 to T7 may be n-channel MOSFETs (NMOS), and the rest may be p-channel MOSFETs (PMOS). In another embodiment, only one of the thin-film transistors T1 to T7 may be an NMOS transistor, and the rest may be PMOS transistors. In yet another embodiment, all of the thin-film transistors T1 to T7 may be NMOS transistors.

The signal lines may include a first scan line SL1 for transmitting a first scan signal Sn', a second scan line SL2 for transmitting a second scan signal Sn', a previous scan line SLp for transmitting a previous scan signal Sn−1 to the first initialization thin-film transistor T4, an emission control line EL for transmitting an emission control signal En to the operation control thin-film transistor T5 and the emission control thin-film transistor T6, a next scan line SLn for transmitting a next scan signal Sn+1 to the second initialization thin-film transistor T7, and a data line DL intersecting the first scan line SL1 and for transmitting a data signal Dm.

The driving voltage line PL may transmit the first power voltage ELVDD to the driving thin-film transistor T1, and the initialization voltage line VIL may transmit an initialization voltage Vint to initialize the driving thin-film transistor T1 and a pixel electrode.

A driving gate electrode of the driving thin-film transistor T1 is connected to the storage capacitor Cst, a driving source region of the driving thin-film transistor T1 is connected to the driving voltage line PL via the operation control thin-film transistor T5, and a driving drain region of the driving thin-film transistor T1 is electrically connected to a pixel electrode of the organic light-emitting diode OLED via the emission control thin-film transistor T6. The driving thin-film transistor T1 may receive the data signal Dm according to a switching operation of the switching thin-film transistor T2 and may supply a driving current IDLED to the organic light-emitting diode OLED.

A switching gate electrode of the switching thin-film transistor T2 is connected to the first scan line SL1, a switching source region of the switching thin-film transistor T2 is connected to the data line DL, and a switching drain region of the switching thin-film transistor T2 is connected to the driving source region of the driving thin-film transistor T1 and is connected to the driving voltage line PL via the operation control thin-film transistor T5. The switching thin-film transistor T2 is turned on according to the first scan signal Sn' received through the first scan line SL1 and performs a switching operation of transmitting the data signal Dm transmitted through the data line DL to the driving source region of the driving thin-film transistor T1.

A compensation gate electrode of the compensation thin-film transistor T3 is connected to the second scan line SL2. A compensation drain region of the compensation thin-film transistor T3 is connected to the driving drain region of the driving thin-film transistor T1 and is connected to the pixel electrode of the organic light-emitting diode OLED via the emission control thin-film transistor T6. A compensation source region of the compensation thin-film transistor T3 is connected to a first electrode CE1 of the storage capacitor Cst and the driving gate electrode of the driving thin-film transistor T1. The compensation source region is connected to a first initialization drain region of the first initialization thin-film transistor T4.

The compensation thin-film transistor T3 may be turned on according to the second scan signal Sn' received through the second scan line SL2 to electrically connect the driving gate electrode and the driving drain region of the driving thin-film transistor T1 thereby having the driving thin-film transistor T1 diode-connected.

A first initialization gate electrode of the first initialization thin-film transistor T4 is connected to the previous scan line SLp. A first initialization source region of the first initialization thin-film transistor T4 is connected to a second initialization source region of the second initialization thin-film transistor T7 and the initialization voltage line VIL. The first initialization drain region of the first initialization thin-film transistor T4 is connected to the first electrode CE1 of the storage capacitor Cst, the compensation source region of the compensation thin-film transistor T3, and the driving gate electrode of the driving thin-film transistor T1. The first initialization thin-film transistor T4 may be turned on according to the previous scan signal Sn−1 received through the previous scan line SLp to perform an initialization operation to initialize a voltage of the driving gate electrode of the driving thin-film transistor T1 by transmitting the initialization voltage Vint to the driving gate electrode of the driving thin-film transistor T1.

An operation control gate electrode of the operation control thin-film transistor T5 is connected to the emission control line EL, an operation control source region of the operation control thin-film transistor T5 is connected to the driving voltage line PL, and an operation control drain region of the operation control thin-film transistor T5 is connected to the driving source region of the driving thin-film transistor T1 and the switching drain region of the switching thin-film transistor T2.

An emission control gate electrode of the emission control thin-film transistor T6 is connected to the emission control line EL, an emission control source region of the emission control thin-film transistor T6 is connected to the driving drain region of the driving thin-film transistor T1 and the compensation drain region of the compensation thin-film transistor T3, and an emission control drain region of the emission control thin-film transistor T6 is electrically connected to a second initialization drain region of the second initialization thin-film transistor T7 and the pixel electrode of the organic light-emitting diode OLED.

The operation control thin-film transistor T5 and the emission control thin-film transistor T6 may be simultaneously turned on according to the emission control signal En received through the emission control line EL, thus the driving voltage ELVDD may be transmitted to the organic light-emitting diode OLED and the driving current $I_{OLED}$ may flow in the organic light-emitting diode OLED.

A second initialization gate electrode of the second initialization thin-film transistor T7 is connected to the next scan line SLn, the second initialization drain region of the second initialization thin-film transistor T7 is connected to the emission control drain region of the emission control thin-film transistor T6 and the pixel electrode of the organic light-emitting diode OLED, and the second initialization source region of the second initialization thin-film transistor T7 is connected to the first initialization source region of the first initialization thin-film transistor T4 and the initialization voltage line VIL. The second initialization thin-film transistor T7 may be, after receiving the next scan signal Sn+1 through the next scan line SLn, turned on according to the next scan signal Sn+1, to initialize the pixel electrode of the organic light-emitting diode OLED.

The second initialization thin-film transistor T7 may be connected to the next scan line SLn. In another embodiment, the second initialization thin-film transistor T7 may be connected to the emission control line EL and may be driven according to the emission control signal En. In another embodiment, the positions of the source regions and the drain regions may be switched according to the types (p-type or n-type) of the transistors.

The storage capacitor Cst may include a first electrode CE1 and a second electrode CE2. The first electrode CE1 of the storage capacitor Cst may be connected to the driving gate electrode of the driving thin-film transistor T1, and the second electrode CE2 of the storage capacitor Cst may be connected to the driving voltage line PL. The storage capacitor Cst may store electric charges corresponding to the difference between the voltage of the driving gate electrode of the driving thin-film transistor T1 and the driving voltage ELVDD.

A detailed operation of each pixel P according to an embodiment may be as follows.

During an initialization period, when the previous scan signal Sn−1 is supplied through the previous scan line SLp, the first initialization thin-film transistor T4 may be turned on in response to the previous scan signal Sn−1, and the driving thin-film transistor T1 may be initialized by the initialization voltage Vint supplied from the initialization voltage line VIL.

During a data programming period, when the first scan signal Sn' and the second scan signal Sn" are supplied through the first scan line SL1 and the second scan line SL2 respectively, the switching thin-film transistor T2 and the compensation thin-film transistor T3 may be turned on in response to the first scan signal Sn' and the second scan signal Sn" respectively. The driving thin-film transistor T1 may be diode-connected by the compensation thin-film transistor T3 that is turned-on, and may be biased in a forward direction.

A compensation voltage (Dm+Vth (not shown), where Vth (not shown) is a negative number) obtained by subtracting a threshold voltage Vth (not shown) of the driving thin-film transistor T1 from the data signal Dm supplied from the data line DL may be applied to the driving gate electrode of the driving thin-film transistor T1.

The driving voltage ELVDD and the compensation voltage Dm+Vth (not shown) may be applied to both ends of the storage capacitor Cst, and electric charges corresponding to the voltage difference between both ends may be stored in the storage capacitor Cst.

During an emission period, the operation control thin-film transistor T5 and the emission control thin-film transistor T6 may be turned on by the emission control signal En supplied from the emission control line EL. The driving current IDLED according to the difference between the voltage of the driving gate electrode of the driving thin-film transistor T1 and the driving voltage ELVDD may be generated, and the driving current IDLED may be supplied to the organic light-emitting diode OLED through the emission control thin-film transistor T6.

In an embodiment, at least one of the thin-film transistors T1 to T7 may include a semiconductor layer including oxide, and the rest may include a semiconductor layer including silicon.

The driving thin-film transistor T1 that directly affects brightness of a display apparatus may include a semiconductor layer formed of polycrystalline silicon having high reliability, thereby implementing a high resolution display apparatus.

Since an oxide semiconductor has high carrier mobility and low leakage current, a voltage drop is not much even when a driving time is long. Since a color change in an image due to a voltage drop is not much even during low frequency driving, low frequency driving may be possible.

As described above, since an oxide semiconductor has low leakage current, at least one of the compensation thin-film transistor T3, the first initialization thin-film transistor T4, and the second initialization thin-film transistor T7 which are connected to the driving gate electrode of the driving thin-film transistor T1 may be provided as an oxide semiconductor to prevent leakage current that may flow to the driving gate electrode and to simultaneously reduce power consumption.

Figure 4:
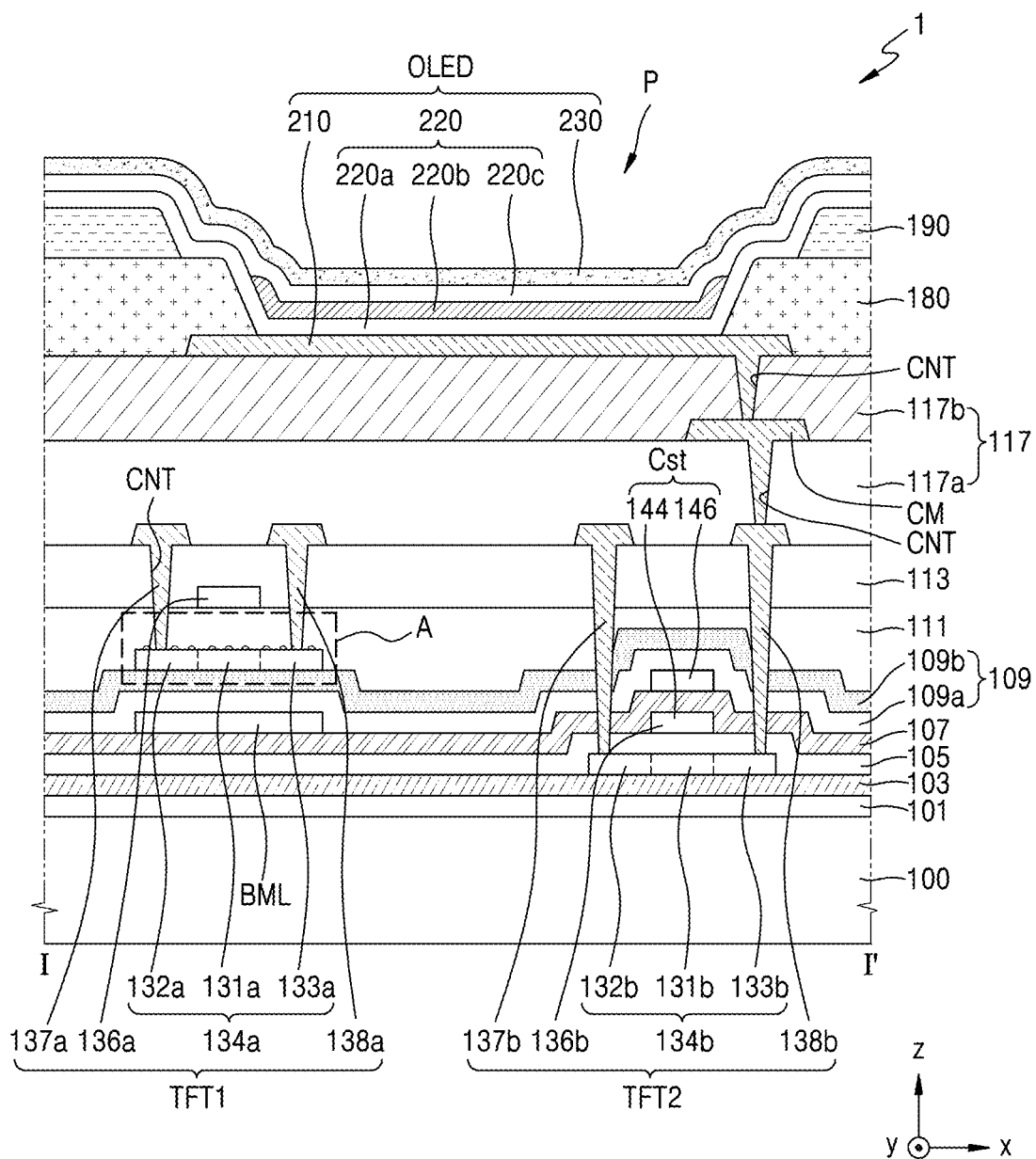
FIG. 4 is a schematic cross-sectional view illustrating a display apparatus according to an embodiment.

FIG. 4 is a schematic cross-sectional view illustrating a pixel P included in a display apparatus 1 according to an embodiment.

Referring to FIG. 4, the display apparatus according to an embodiment may include a first thin-film transistor TFT1, a second thin-film transistor TFT2, and an organic light-emitting diode OLED. For example, the first thin-film transistor TFT1 may be at least one of the compensation thin-film transistor T3, the first initialization thin-film transistor T4, and the second initialization thin-film transistor T7 described above, and the second thin-film transistor TFT2 may be the driving thin-film transistor T1 described above.

The substrate 100 may include a glass material, a ceramic material, a metal material, or a material having flexible or bendable properties. In case that the substrate 100 has flexible or bendable properties, the substrate 100 may include a high molecular weight resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a monolayer or multilayer structure including the above material.

A barrier layer 101 may be disposed on the substrate 100. The barrier layer 101 may include an inorganic material such as oxide or nitride, an organic material, or an organic/inorganic composite, and may have a monolayer or multilayer structure of an inorganic material and an organic material.

A buffer layer 103 may be disposed on the barrier layer 101. The buffer layer 103 may be disposed on the substrate 100 to prevent or reduce penetration of impurities, humidity, or external gas from the underneath the substrate 100 and provide a planarized surface on the substrate 100. The buffer layer 103 may include an inorganic material such as oxide or nitride, an organic material, or an organic/inorganic composite, and may have a monolayer or multilayer structure of an inorganic material and an organic material.

The first thin-film transistor TFT1 and the second thin-film transistor TFT2 may be disposed on the substrate 100. The first thin-film transistor TFT1 may include a first semiconductor layer 134a, a first gate electrode 136a, a first source electrode 137a, and a first drain electrode 138a. The second thin-film transistor TFT2 may include a second semiconductor layer 134b, a second gate electrode 136b, a second source electrode 137b, and a second drain electrode 138b.

The second semiconductor layer 134b may be disposed on the buffer layer 103. The second semiconductor layer 134b may include a second channel area 131b, a second source region 132b and a second drain region 133b. The second source region 132b and the second drain region 133b may be disposed at both sides of the second channel area 131b. The second source region 132b and the second drain region 133b may include impurities. The impurities may be N-type impurities or P-type impurities. The second source region 132b and the second drain region 133b may be electrically connected to the second source electrode 137b and the second drain electrode 138b, respectively.

The second semiconductor layer 134b may include a silicon semiconductor material. The second semiconductor layer 134b may include amorphous silicon (a-Si) or low temperature poly-silicon (LTPS) formed by crystallizing amorphous silicon (a-Si).

A first insulating layer 105 may be disposed on the second semiconductor layer 134b. The first insulating layer 105 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 105 may be a single layer or multiple layers including the inorganic insulating materials described above.

The second gate electrode 136b may be disposed on the first insulating layer 105. The second gate electrode 136b may overlap at least a portion of the second semiconductor layer 134b. For example, the second gate electrode 136b may overlap the second channel area 131b of the second semiconductor layer 134b. The second gate electrode 136b may be formed in a single layer or multiple layers of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A second insulating layer 107 may be disposed on the second gate electrode 136b. The second insulating layer 107 may include at least one inorganic insulating material selected from the group consisting of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 107 may be a single layer or multiple layers including the inorganic insulating materials described above.

The storage capacitor Cst may be disposed on the first insulating layer 105. The storage capacitor Cst may include a lower electrode 144 and an upper electrode 146 that overlaps the lower electrode 144. The lower electrode 144 and the upper electrode 146 of the storage capacitor Cst may overlap each other with the second insulating layer 107 therebetween.

In an embodiment, the lower electrode 144 of the storage capacitor Cst may overlap the second gate electrode 136b of the second thin film transistor TFT2, and the lower electrode 144 of the storage capacitor Cst and the second gate electrode 136b of the second thin film transistor TFT2 may be integral with each other. In another embodiment, the lower electrode 144 of the storage capacitor Cst may be disposed on the first insulating layer 105 as an independent component that does not overlap the second gate electrode 136b of the second thin film transistor TFT2.

The upper electrode 146 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may be a single layer or multiple layers of the materials described above.

A third insulating layer 109 may be disposed on the upper electrode 146 of the storage capacitor Cst. The third insulating layer 109 may include at least one inorganic insulating material selected from the group consisting of silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 109 may be a single layer or multiple layers including the inorganic insulating materials described above. In an embodiment, in case that the third insulating layer 109 is provided as multiple layers, the third insulating layer 109 may include a first layer 109a including silicon oxide ($SiO_x$) and a second layer 109b including silicon nitride ($SiN_x$). In another embodiment, the third insulating layer 109 may include a first layer 109a including silicon nitride ($SiN_x$) and a second layer 109b including silicon oxide ($SiO_x$).

The first semiconductor layer 134a may be disposed on the third insulating layer 109. In an embodiment, the first semiconductor layer 134a and the second semiconductor layer 134b may be disposed on different layers. In another embodiment, the first semiconductor layer 134a and the second semiconductor layer 134b may be disposed on a same layer.

The first semiconductor layer 134a may include a first channel area 131a, a first source region 132a. The first source region 132a and the first drain region 133a may be disposed at both sides of the first channel area 131a. The first source region 132a and the first drain region 133a may include impurities. The impurities may be N-type impurities or P-type impurities. For example, the first source region 132a and the first drain region 133a may each include fluorine or hydrogen.

The first source region 132a and the first drain region 133a may be electrically connected to the first source electrode 137a and the first drain electrode 138a, respectively.

The first semiconductor layer 134a may include an oxide semiconductor material. For example, the first semiconductor layer 134a may include oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the first semiconductor layer 134a may be formed of ITZO (InSnZnO), IGZO (InGaZnO), or the like.

Since the first semiconductor layer 134a is formed of an oxide semiconductor, it may have a wide band gap (about 3.1 eV), high carrier mobility, and low leakage current. Therefore, because a voltage drop of the organic light-emitting diode OLED according to an embodiment is not much even when a driving time is long, a change in luminance due to the voltage drop may not be much even during low frequency driving.

Figure 5:
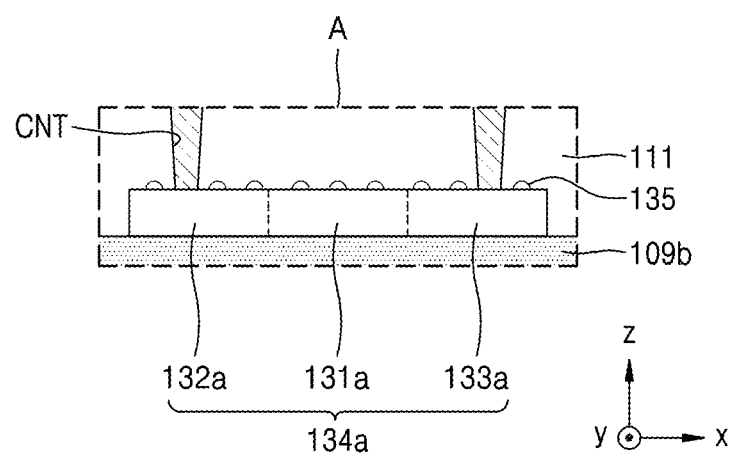
FIG. 5 is a schematic cross-sectional view illustrating a display apparatus according to an embodiment.
Figure 6:
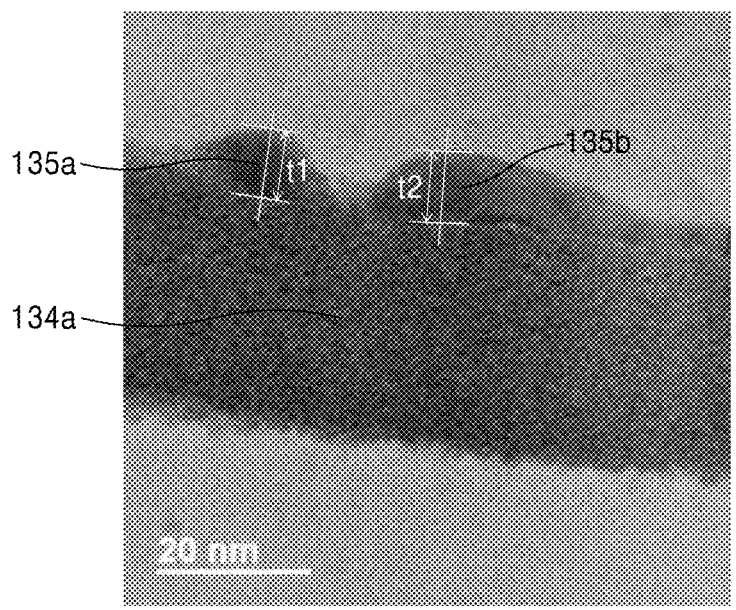
FIG. 6 is an image illustrating the result of TEM analysis on a first semiconductor layer according to an embodiment.

FIG. 5 is a schematic cross-sectional view illustrating a display apparatus according to an embodiment, FIG. 6 is an image illustrating the result of TEM analysis on a first semiconductor layer according to an embodiment, and FIG. 7 is a table illustrating the composition of each area of a first semiconductor layer according to an embodiment. FIG. 5 illustrates an enlarged cross-sectional view of portion A of FIG. 4, FIG. 6 illustrates the result of analysis using a transmission electron microscope after increasing the roughness of an IGZO layer, and FIG. 7 is a table illustrating the compositions of the first protruding portion, the second protruding portion, and the body portion of the first semiconductor layer.

Referring to FIG. 5, the first semiconductor layer 134a may include protruding portions 135 formed on a surface thereof. As will be described below, by performing treatment using plasma, such as N₂O plasma treatment and H₂ plasma treatment, on the surface of the first semiconductor layer 134a, the protruding portions 135 may be formed on a surface of the first semiconductor layer 134a. For example, N₂O plasma treatment or H₂ plasma treatment may be performed on the entire area of the first semiconductor layer 134a to form the protruding portions 135 on the entire area of the first semiconductor layer 134a, thereby increasing the roughness of the first semiconductor layer 134a.

Referring to FIG. 6, the first semiconductor layer 134a of the display apparatus according to an embodiment may include protruding portions 135a and 135b protruding upward. The first protruding portion 135a may protrude from the surface (upper surface) of the first semiconductor layer 134a by a first thickness t1, and the second protruding portion 135b may protrude from the surface (upper surface) of the first semiconductor layer 134a by a second thickness t2. For example, the first thickness t1 may be about 8.983 nm, and the second thickness t2 may be about 9.299 nm.

Since the first semiconductor layer 134a may include the protruding portions 135 arranged on the surface (upper surface) thereof, the surface roughness of the first semiconductor layer 134a may increase. In an embodiment, the surface roughness of the first semiconductor layer 134a may be in a range of about 5 nm to about 50 nm. For example, the surface roughness of the first semiconductor layer 134a may be in a range of about 10 nm to about 40 nm, or about 5 nm to about 35 nm. For example, the first semiconductor layer 134a may have a surface roughness in a range of about 2 nm to about 30 nm.

Referring to FIG. 7, the body portion of the first semiconductor layer 134a has a composition of 56.24 at % oxygen (O), 13.78 at % zinc (Zn), 19.29 at % gallium (Ga), and 10.67 at % indium (In), the first protruding portion 135a has a composition of 62.94 at % oxygen (O), 3.18 at % zinc (Zn), 4.74 at % gallium (Ga), and 29.12 at % indium (In), and the second protruding portion 135b has a composition of 59.12 at % oxygen (O), 2.46 at % zinc (Zn), 3.86 at % gallium (Ga), and 34.56 at % indium (In).

It can be seen that the protruding portions 135a and 135b have increased indium (In) contents and decreased gallium (Ga) or zinc (Zn) contents, compared to those of the body portion of the first semiconductor layer 134a. It can be also seen that the protruding portions 135a and 135b have indium (In) contents higher than the gallium (Ga) or zinc (Zn) contents.

Referring back to FIG. 4, a lower metal layer BML may be disposed on the second insulating layer 107. The lower metal layer BML may be disposed under the first semiconductor layer 134a to overlap the first semiconductor layer 134a. In an embodiment, the lower metal layer BML and the upper electrode 146 of the storage capacitor Cst may be disposed on a same layer. In another embodiment, the lower metal layer BML and the upper electrode 146 of the storage capacitor Cst may be disposed on different layers.

The lower metal layer BML may include a conductive material including molybdenum (Mo), aluminum (Al), copper (Cu), titanium (Ti), or the like, and may be formed in a single layer or multiple layers including the materials described above. For example, the lower metal layer BML may have a multilayer structure of Ti/Al/Ti.

Since the first semiconductor layer 134a including an oxide semiconductor material is vulnerable to light, the lower metal layer BML may prevent the properties of the first thin-film transistor TFT1 including the oxide semiconductor material from being changed due to the occurrence of a photocurrent on the first semiconductor layer 134a by external light incident from the substrate 100.

A fourth insulating layer 111 may be disposed on the first semiconductor layer 134a. The fourth insulating layer 111 disposed on the first semiconductor layer 134a may be not etched, and may overlap the first semiconductor layer 134a. In an embodiment, the fourth insulating layer 111 may overlap the entire area of the first semiconductor layer 134a. As the fourth insulating layer 111 is not etched, the distribution of the threshold voltage Vth (not shown) may be reduced. The fourth insulating layer 111 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The fourth insulating layer 111 may be a single layer or multiple layers including the inorganic insulating materials described above.

The first gate electrode 136a may be disposed on the fourth insulating layer 111. The first gate electrode 136a may overlap at least a portion of the first semiconductor layer 134a. For example, the first gate electrode 136a may overlap the first channel area 131a of the first semiconductor layer 134a. The first gate electrode 136a may be formed in a single layer or multiple layers of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment, the first gate electrode 136a and the second gate electrode 136b may be disposed on different layers. In another embodiment, the first gate electrode 136a and the second gate electrode 136b may be disposed on a same layer.

A fifth insulating layer 113 may be disposed on the first gate electrode 136a. The fifth insulating layer 113 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The fifth insulating layer 113 may be a single layer or multiple layers including the inorganic insulating materials described above.

The first source electrode 137a, the first drain electrode 138a, the second source electrode 137b, and the second drain electrode 138b may be disposed on the fifth insulating layer 113. The first source electrode 137a, the first drain electrode 138a, the second source electrode 137b, and the second drain electrode 138b may include a conductive material including molybdenum (Mo), aluminum (Al), copper (Cu), titanium (Ti), or the like, and may be formed in a single layer or multiple layers including the materials described above. The first source electrode 137a, the first drain electrode 138a, the second source electrode 137b, and the second drain electrode 138b may each have a multilayer structure of Ti/Al/Ti.

The first source electrode 137a may be connected to the first source region 132a through a contact hole CNT, and the first drain electrode 138a may be connected to the first drain region 133a through a contact hole CNT. The second source electrode 137b may be connected to the second source region 132b through a contact hole CNT, and the second drain electrode 138b may be connected to the second drain region 133b through a contact hole CNT.

A planarization layer 117 may be disposed on the first source electrode 137a, the first drain electrode 138a, the second source electrode 137b, and the second drain electrode 138b. The planarization layer 117 may include an organic material or an inorganic material, and may have a monolayer structure or a multilayer structure. The planarization layer 117 may include a first planarization layer 117a and a second planarization layer 117b. Accordingly, a conductive pattern, such as a line, may be formed between the first planarization layer 117a and the second planarization layer 117b, and thus high integration may be achieved. However, the second planarization layer 117b may be omitted.

In an embodiment, the planarization layer 117 may include a general-purpose polymer such as benzocyclobutene (BCB), polyimide (PI), hexamethyldisiloxane (HMDSO), polymethylmethacrylate (PMMA) or polystyrene (PS), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, or a blend thereof. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 117 is formed, chemical mechanical polishing may be performed to provide a flat upper surface.

A contact metal layer CM may be disposed on the first planarization layer 117a. The contact metal layer CM may include aluminum (Al), copper (Cu), titanium (Ti), or the like, and may be formed in a single layer or multiple layers. The contact metal layer CM may have a multilayer structure of Ti/Al/Ti.

The organic light-emitting diode OLED including a pixel electrode 210, an intermediate layer 220, and an opposite electrode 230 may be disposed on the planarization layer 117. The pixel electrode 210 may be electrically connected to the contact metal layer CM via the contact hole CNT penetrating through the second planarization layer 117b, and the contact metal layer CM may be electrically connected to the second source electrode 137b or the second drain electrode 138b of the second thin-film transistor TFT2 via the contact hole CNT penetrating through the first planarization layer 117a, such that the organic light-emitting diode OLED may be electrically connected to the second thin-film transistor TFT2.

The pixel electrode 210 may be disposed on the second planarization layer 117b. The pixel electrode 210 may be a (semi)transparent electrode or a reflective electrode. The pixel electrode 210 may include a reflective film formed of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a compound thereof, and a transparent or semi-transparent electrode layer formed on the reflective film. The transparent or semitransparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stacked structure of ITO/Ag/ITO.

A pixel defining layer 180 may be disposed on the second planarization layer 117b, and the pixel defining layer 180 may have an opening exposing at least a portion of the pixel electrode 210. The portion exposed by the opening of the pixel defining layer 180 may be defined as an emission area. The periphery of emission areas may be a non-emission area, and the non-emission area may surround the emission areas. For example, the display area DA may include emission areas and a non-emission area surrounding the emission areas. The pixel defining layer 180 may prevent an arc or the like from occurring at the edge of the pixel electrode 210 by increasing the distance between the upper portion of the pixel electrode 210 and the opposite electrode 230. The pixel defining layer 180 may be formed of an organic insulating material such as polyimide, polyamide, acryl resin, benzocyclobutene, hexamethyldisiloxane (HMDSO) and phenol resin using a method such as spin coating.

A spacer 190 for preventing mask scratches may be arranged disposed on the pixel defining layer 180. The spacer 190 and the pixel defining layer 180 may be integral with each other. For example, the spacer 190 and the pixel defining layer 180 may be simultaneously formed in a same process using a halftone mask.

The intermediate layer 220 may be disposed on the pixel electrode 210, at least a portion of which is exposed by the pixel defining layer 180. The intermediate layer 220 may include an emission layer 220b, and a first functional layer 220a and a second functional layer 220c may be selectively disposed below and on the emission layer 220b, respectively.

In an embodiment, the intermediate layer 220 may be disposed on the pixel electrode 210, at least a portion of which is exposed by the pixel defining layer 180. For example, the emission layer 220b of the intermediate layer 220 may be disposed on the pixel electrode 210, at least a portion of which is exposed by the pixel defining layer 180.

The first functional layer 220a may be disposed below the emission layer 220b, and the second functional layer 220c may be disposed on the emission layer 220b. The first functional layer 220a and the second functional layer 220c disposed below and on the emission layer 220b may be collectively referred to as organic functional layers.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent or phosphorescent material that emits red, green, blue, or white light. The emission layer 220b may include a low molecular weight organic material or a high molecular weight organic material.

In case that the emission layer 220b includes a low molecular weight organic material, the intermediate layer 220 may have a structure in which a hole injection layer, a hole transport layer, an emission layer, an electron transport layer, an electron injection layer, or the like may be stacked in a single or composite structure, and the low molecular weight organic material may be various organic materials such as copper phthalocyanine (CuPc), N,N'-di(naphthalene-1-yl)-N,N'-diphenyl-benzidine (NPB), tris-8-hydroxyquinoline aluminum (Alq3), or the like. These layers may be formed by vacuum deposition.

In case that the emission layer 220b includes a high molecular weight organic material, the intermediate layer 220 may have a structure including a hole transport layer and the emission layer 220b. The hole transport layer may include PEDOT, and the emission layer 220b may include a high molecular weight material, such as a poly-phenylene vinylene (PPV)-based material or a polyfluorene-based material. The emission layer 220b may be formed by screen printing, inkjet printing, laser induced thermal imaging (LITI), or the like.

The opposite electrode 230 may be disposed on the intermediate layer 220. The opposite electrode 230 may be disposed on the intermediate layer 220 to cover the entire surface of the intermediate layer 220. The opposite electrode 230 may be disposed above the display area DA to cover the entire surface of the display area DA. For example, the opposite electrode 230 may be integrally formed on the entire display area using an open mask to cover the pixels P disposed in the display area DA.

The opposite electrode 230 may include a conductive material having a low work function. For example, in an embodiment, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In another embodiment, the opposite electrode 230 may further include a layer such as ITO, IZO, ZnO, or $In_2O_3$ on the (semi)transparent layer including the materials described above.

In an embodiment, the organic light-emitting diode OLED may be covered by a thin-film encapsulation layer. The thin-film encapsulation layer may include at least one inorganic encapsulation layer and at least one organic encapsulation layer. In another embodiment, the organic light-emitting diode OLED may be covered by an encapsulation substrate.

FIGS. 8 to 13 are schematic cross-sectional views illustrating a method of manufacturing a display apparatus according to an embodiment.

Hereinafter, a method of manufacturing a display apparatus will be sequentially described with reference to FIGS. 8 to 13.

Referring to FIGS. 8 to 13, a method of manufacturing a display apparatus according to an embodiment may include forming a first semiconductor layer 134a including an oxide semiconductor material on a substrate 100, increasing the surface roughness of the first semiconductor layer 134a, forming an insulating layer (e.g., a fourth insulating layer 111) on the first semiconductor layer 134a, forming a metal layer 136M on the insulating layer (e.g., the fourth insulating layer 111), and patterning the metal layer 136M to form a gate electrode (e.g., a first gate electrode 136a).

The method may further include, prior to forming the first semiconductor layer 134a including an oxide semiconductor material on the substrate 100, forming a second semiconductor layer 134b including a silicon semiconductor material on the substrate 100 and forming a lower metal layer BML to overlap the first semiconductor layer 134a.

Figure 8:
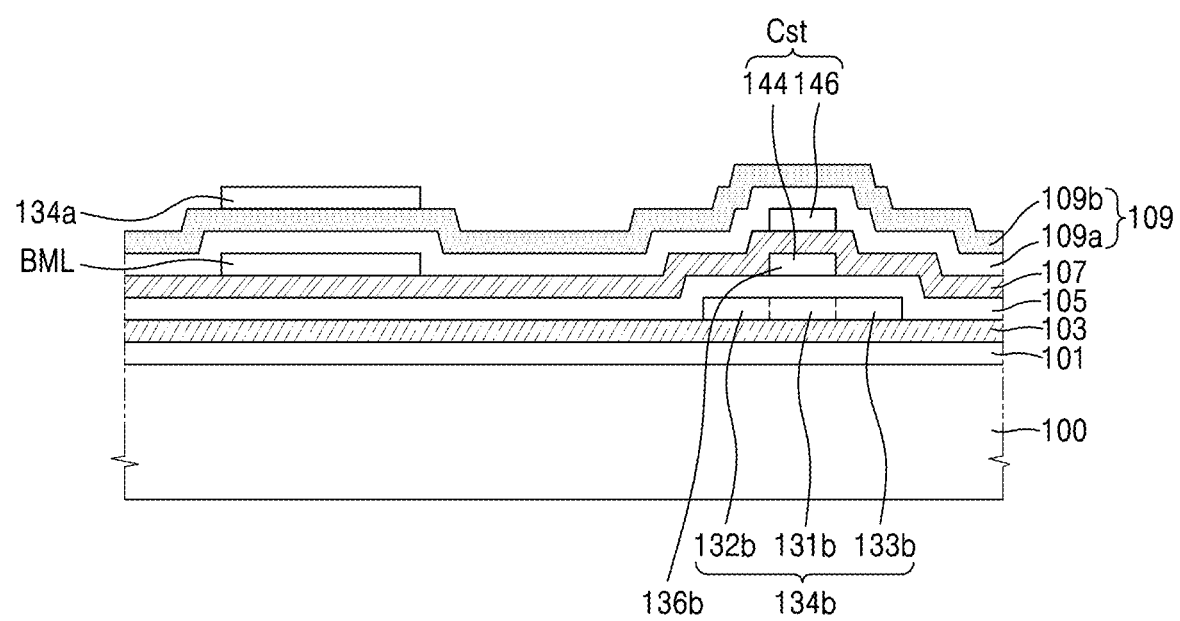
FIGS. 8 to 13 are schematic cross-sectional views illustrating a method of manufacturing a display apparatus according to an embodiment.

Referring to FIG. 8, a second semiconductor layer 134b, a second gate electrode 136b, an upper electrode 146, and a lower metal layer BML may be formed on the substrate 100. The second semiconductor layer 134b may include a silicon semiconductor material. The second semiconductor layer 134b may include amorphous silicon (a-Si) or low temperature poly-silicon (LTPS) formed by crystallizing amorphous silicon (a-Si).

A barrier layer 101 and a buffer layer 103 may be formed on the substrate 100, a first insulating layer 105 may be formed on the second semiconductor layer 134b, a second insulating layer 107 may be formed on the second gate electrode 136b, and a third insulating layer 109 may be formed on the upper electrode 146 and the lower metal layer BML.

The first semiconductor layer 134a may be formed on the third insulating layer 109. The first semiconductor layer 134a may include an oxide semiconductor material. For example, the first semiconductor layer 134a may include oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the first semiconductor layer 134a may be formed of ITZO (InSnZnO), IGZO (InGaZnO), or the like.

In an embodiment, the first semiconductor layer 134a and the second semiconductor layer 134b may be disposed on different layers. In another embodiment, the first semiconductor layer 134a and the second semiconductor layer 134b may be disposed on a same layer.

Figure 9:
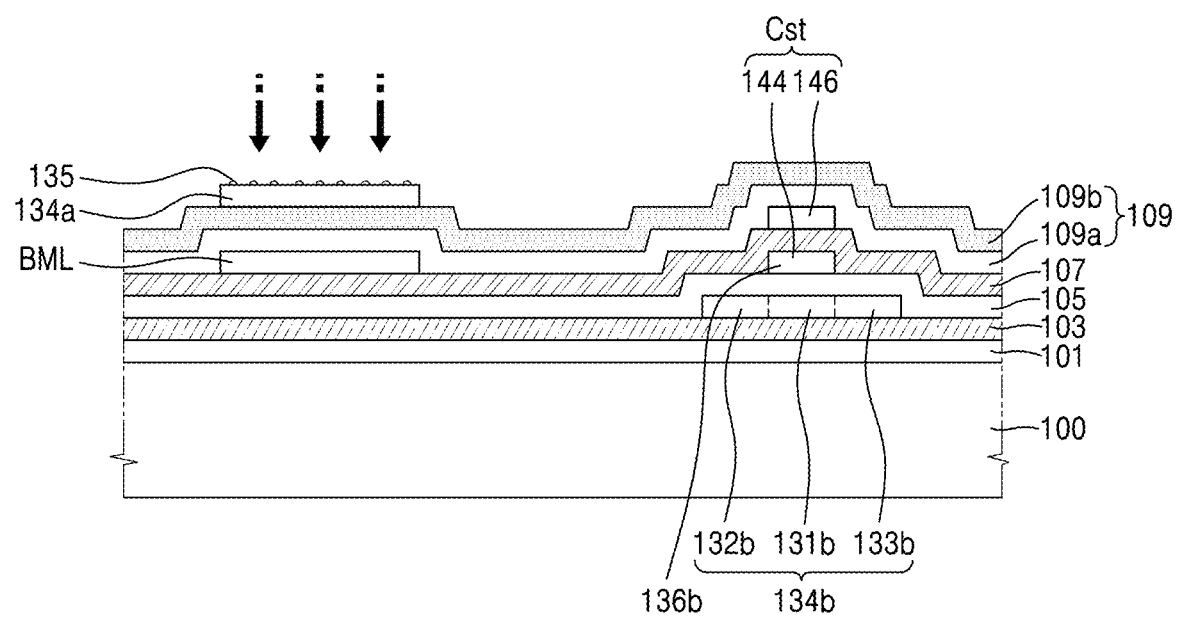

Referring to FIG. 9, the method may further include, after forming the first semiconductor layer 134a including an oxide semiconductor material on the substrate 100, increasing a surface roughness of the first semiconductor layer 134a.

In increasing the surface roughness of the first semiconductor layer 134a, protruding portions 135 may be formed on the surface of the first semiconductor layer 134a. In an embodiment, treatment using plasma may be performed on the surface of the first semiconductor layer 134a to form protruding portions 135 on the surface of the first semiconductor layer 134a, thereby increasing a surface roughness of the first semiconductor layer 134a.

As a method of increasing a surface roughness of the first semiconductor layer 134a, $N_2O$ plasma treatment, $H_2$ plasma treatment, plasma treatment by increasing silane ($SiH_4$) or by increasing the CVD power of an insulating layer (e.g., the fourth insulating layer 111) to be described below, or the like may be used. The surface roughness of the entire surface of the first semiconductor layer 134a may be increased by $N_2O$ plasma treatment, $H_2$ plasma treatment, or the like. For example, a surface roughness of the first semiconductor layer 134a may be in a range of about 2 nm to about 30 nm.

The upper portion of the first semiconductor layer 134a, a surface roughness of which is increased, may have an increased indium (In) content and a decreased gallium (Ga) content or zinc (Zn) content, compared to the body portion of the first semiconductor layer 134a. The upper portion of the first semiconductor layer 134a, the surface roughness of which is increased, may have an atomic percentage (at %) of indium (In) higher than an atomic percentage (at %) of gallium (Ga) or an atomic percentage (at %) of zinc (Zn).

Figure 10:
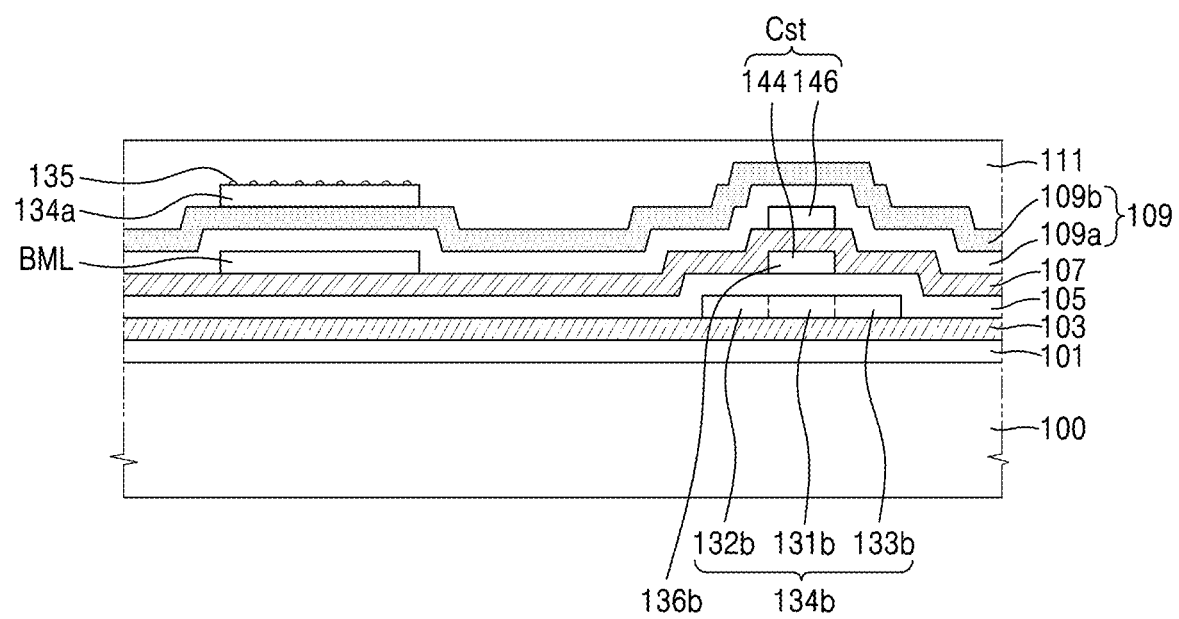

Referring to FIG. 10, after increasing the surface roughness of the first semiconductor layer 134a, an insulating layer (e.g., the fourth insulating layer 111) may be formed on the first semiconductor layer 134a.

The insulating layer (e.g., the fourth insulating layer 111) formed on the first semiconductor layer 134a may be not etched, and may overlap the first semiconductor layer 134a. In an embodiment, the insulating layer (e.g., the fourth insulating layer 111) may overlap the entire area of the first semiconductor layer 134a. Since the fourth insulating layer 111 may be not etched, the distribution of the threshold voltage Vth (not shown) may be reduced.

Figure 11:
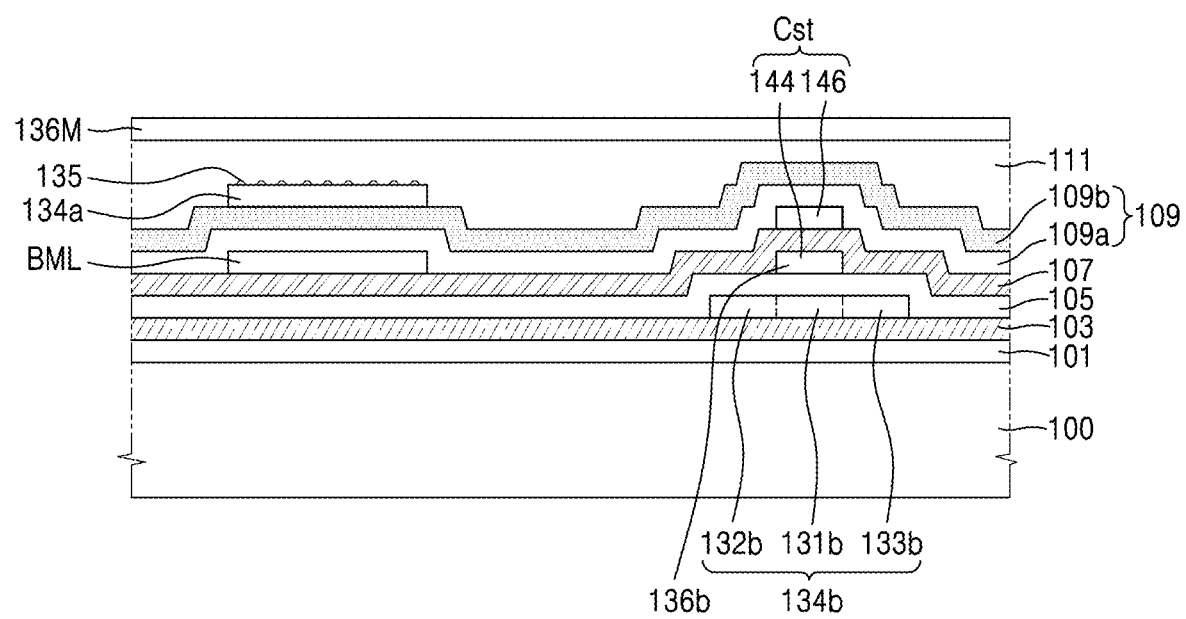

Referring to FIG. 11, after forming the insulating layer (e.g., the fourth insulating layer 111) on the first semiconductor layer 134a, a metal layer 136M may be formed on the insulating layer (e.g., the fourth insulating layer 111).

The metal layer 136M may be formed in a single layer or multiple layers of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

Figure 12:
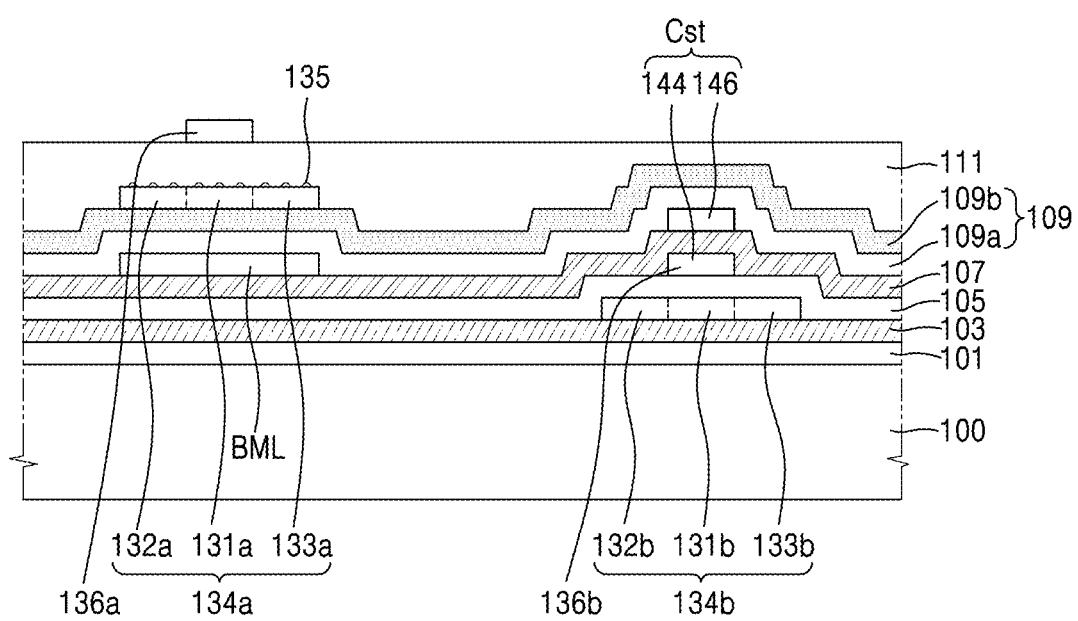

Referring to FIG. 12, after forming the metal layer 136M on the insulating layer (e.g., the fourth insulating layer 111), the metal layer 136M may be patterned to form a gate electrode (e.g., the first gate electrode 136a).

In an embodiment, the metal layer 136M formed on the insulating layer (e.g., the fourth insulating layer 111) may be patterned by a dry etching process. For example, the metal layer 136M may be patterned into a gate electrode (e.g., the first gate electrode 136a) by using dry etching gas such as $NF_6$ and $CF_4$. Heat treatment on the patterned gate electrode (e.g., the first gate electrode 136a) may be further performed.

When the metal layer 136M is patterned into a gate electrode (e.g., the first gate electrode 136a) using dry etching gas such as $NF_6$ and $CF_4$ and the heat treatment is performed on the patterned gate electrode (e.g., the first gate electrode 136a), fluorine or hydrogen may be diffused into at least a portion of the first semiconductor layer 134a to form an N+ conductive area (e.g., the first source region 132a and the first drain region 133a).

As described above, since a surface roughness of the first semiconductor layer 134a may be increased thereby increasing the contact area per unit length between the first semiconductor layer 134a and fluorine or hydrogen, and the proportion of indium (In) of the surface of the first semiconductor layer 134a may be increased thereby improving the reactivity with fluorine or hydrogen, fluorine may be more diffusible into the N+ conductive area (e.g., the first source region 132a and the first drain region 133a), and thus the conductivity of the N+ conductive area (e.g., the first source region 132a and the first drain region 133a) may be improved. For example, the carrier concentration per unit area of the N+ conductive area (e.g., the first source region 132a and the first drain region 133a) may be increased, thereby improving the conductivity.

Since the reactivity between the N+ conductive area (e.g., the first source region 132a and the first drain region 133a) and fluorine or hydrogen may be increased (the proportion of oxygen vacancies may be increased), fluorine or hydrogen may be prevented from being diffused into the channel area (e.g., the first channel area 131a) of the first semiconductor layer 134a.

Figure 13:
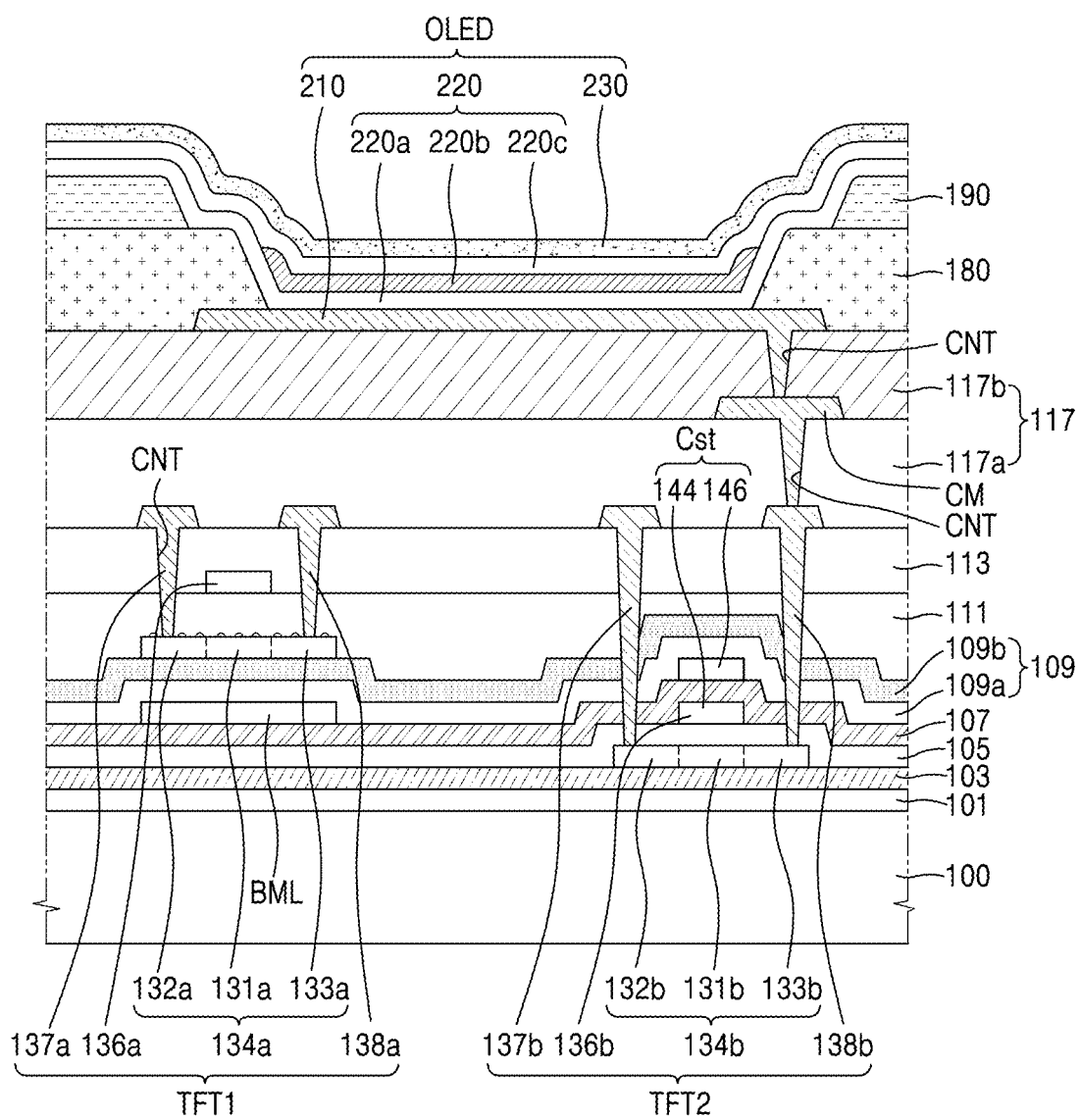

Referring to FIG. 13, after patterning the metal layer 136M to form a gate electrode (e.g., the first gate electrode 136a), an organic light-emitting diode OLED may be formed on the gate electrode (e.g., the first gate electrode 136a).

A fifth insulating layer 113 may be formed on the gate electrode (e.g., the first gate electrode 136a), and a first source electrode 137a, a first drain electrode 138a, a second source electrode 137b, and a second drain electrode 138b may be formed on the fifth insulating layer 113.

A planarization layer 117 may be formed on the first source electrode 137a, the first drain electrode 138a, the second source electrode 137b, and the second drain electrode 138b. The planarization layer 117 may include a first planarization layer 117a and a second planarization layer 117b. The organic light-emitting diode OLED including a pixel electrode 210, an intermediate layer 220, and an opposite electrode 230 may be formed on the planarization layer 117.

Because the insulating layer (e.g., the fourth insulating layer 111) disposed on the semiconductor layer including an oxide semiconductor material is not etched, diffusion of hydrogen serving as a carrier may be reduced, resulting in a reduction in the on current.

In order to solve the problems described above, the conductivity of the N+ conductive area (e.g., the first source region 132a and the first drain region 133a) may be improved by increasing the surface roughness of the semiconductor layer (e.g., the first semiconductor layer 134a), thereby improving the on current and device properties at the same time.

In an embodiment, the surface roughness of the semiconductor layer (e.g., the first semiconductor layer 134a) may be increased by a method such as $N_2O$ plasma treatment, $H_2$ plasma treatment, plasma treatment by increasing silane ($SiH_4$) or by increasing the CVD power of an insulating layer (e.g., the fourth insulating layer 111) or the like. The upper portion of the semiconductor layer (e.g., the first semiconductor layer 134a), the surface roughness of which is increased, may have an increased indium (In) content and a decreased gallium (Ga) content or zinc (Zn) content.

In an embodiment, since etching the insulating layer (e.g., the fourth insulating layer 111) formed on the semiconductor layer (e.g., the first semiconductor layer 134a) may be omitted, the distribution of the threshold voltage Vth (not shown) may be reduced.

In an embodiment, since the surface roughness of the semiconductor layer (e.g., the first semiconductor layer 134a) may be increased thereby increasing the contact area per unit length between the semiconductor layer (e.g., the first semiconductor layer 134a) and fluorine or hydrogen, and the proportion of indium (In) of the upper portion of the semiconductor layer (e.g., the first semiconductor layer 134a) may be increased thereby improving reactivity, fluorine or hydrogen or the like may be more diffusible into the N+ conductive area (e.g., the first source region 132a and the first drain region 133a), the carrier concentration per unit area of the N+ conductive area (e.g., the first source region 132a and the first drain region 133a) may be increased, and thus conductivity may be improved.

In an embodiment, since the reactivity between the N+ conductive area (e.g., the first source region 132a and the first drain region 133a) and fluorine or hydrogen may be increased (the proportion of oxygen vacancies may be increased), fluorine or hydrogen may be prevented from being diffused into the channel area (e.g., the first channel area 131a) of the first semiconductor layer 134a.

According to an embodiment described above, since the pixel circuit for driving a display device includes the first thin-film transistor including an oxide semiconductor material and the second thin-film transistor including a silicon semiconductor material, it is possible to provide a high resolution display apparatus having low power consumption.

The disclosure has been described with reference to the embodiments illustrated in the drawings, but this is merely illustrative, and it will be understood by those of skill in the art that various modifications and other equivalent embodiments are possible from the embodiments. Therefore, the technical scope of the disclosure should be defined by the technical spirit of the accompanying claims.

What is claimed is:
1. A display apparatus comprising:
a substrate including a display area, and a non-display area adjacent to the display area;
a first thin-film transistor disposed on the substrate and including a first semiconductor layer including an oxide semiconductor material; and a second thin-film transistor disposed on the substrate and including a second semiconductor layer including a silicon semiconductor material, wherein a surface roughness of the first semiconductor layer is increased by plasma treatment, and an indium (In) content of a protruding portion is greater than an indium (In) content of a body portion of the first semiconductor layer, the protruding portion is formed on a surface of the first semiconductor layer by the plasma treatment, and the indium (In) content of the protruding portion is greater than a gallium (Ga) content of the protruding portion or a zinc (Zn) content of the protruding portion.

2. The display apparatus of claim 1, wherein the surface roughness of the first semiconductor layer is in a range of about 2 nm to about 30 nm.

3. The display apparatus of claim 1, wherein the first semiconductor layer comprises an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

4. The display apparatus of claim 1, wherein the first thin-film transistor comprises:

a gate electrode overlapping the first semiconductor layer; and an insulating layer disposed between the first semiconductor layer and the gate electrode.

5. The display apparatus of claim 4, wherein the insulating layer overlaps the first semiconductor layer.

6. The display apparatus of claim 1, wherein the first semiconductor layer and the second semiconductor layer are disposed on different layers.

7. The display apparatus of claim 1, further comprising:

a lower metal layer disposed between the substrate and the first semiconductor layer to overlap the first semiconductor layer.

8. A method of manufacturing a display apparatus, the method comprising:

forming a first semiconductor layer including an oxide semiconductor material on a substrate;

increasing a surface roughness of the first semiconductor layer;

forming an insulating layer on the first semiconductor layer;

forming a metal layer on the insulating layer; and patterning the metal layer to form a gate electrode, wherein the increasing of the surface roughness of the first semiconductor layer comprises performing a plasma treatment on a surface of the first semiconductor layer to form a protruding portion on the surface of the first semiconductor layer, an indium (In) content of the protruding portion is greater than an indium (In) content of a body portion of the first semiconductor layer, and the indium (In) content of the protruding portion is greater than a gallium (Ga) content of the protruding portion or a zinc (Zn) content of the protruding portion.

9. The method of claim 8, further comprising, prior to the forming of the first semiconductor layer including the oxide semiconductor material on the substrate:

forming a second semiconductor layer including a silicon semiconductor material on the substrate.

10. The method of claim 9, further comprising, prior to the forming of the first semiconductor layer including the oxide semiconductor material on the substrate:

forming a lower metal layer to overlap the first semiconductor layer.

11. The method of claim 9, wherein the first semiconductor layer and the second semiconductor layer are formed on different layers.

12. The method of claim 8, wherein the surface roughness of the first semiconductor layer is in a range of about 2 nm to about 30 nm.

13. The method of claim 8, wherein the patterning of the metal layer to form the gate electrode comprises:

diffusing impurities into the first semiconductor layer to form a drain region and a source region.

14. The method of claim 8, wherein the first semiconductor layer comprises an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

15. The method of claim 8, wherein the insulating layer overlaps the first semiconductor layer.

* * * * *